US006366486B1

(12) United States Patent
Chen et al.

(10) Patent No.: US 6,366,486 B1
(45) Date of Patent: Apr. 2, 2002

(54) POWER SUPPLY DEVICE FOR ENHANCING HEAT-DISSIPATING EFFECT

(75) Inventors: Kun-Feng Chen; Yi-Hwa Hsieh; Ko-Yu Hsiao, all of Taoyuan Shien (TW)

(73) Assignee: Delta Electronics Inc., Taoyuan Shien (TW)

( * ) Notice: Subject to any disclaimer, the term of this patent is extended or adjusted under 35 U.S.C. 154(b) by 0 days.

(21) Appl. No.: 09/791,257

(22) Filed: Feb. 22, 2001

(30) Foreign Application Priority Data

Aug. 29, 2000 (TW) .......................... 089117541

(51) Int. Cl.⁷ ............................. H02M 1/00; H05K 7/20
(52) U.S. Cl. ........................................ 363/141; 361/707
(58) Field of Search ................................. 363/141, 144; 361/719, 720, 382, 386, 705, 707; 174/252

(56) References Cited

U.S. PATENT DOCUMENTS 5,133,403 A * 7/1992 Yokono et al. .............. 165/185
5,258,887 A * 11/1993 Fourtune .................... 361/720

* cited by examiner

Primary Examiner—Rajnikant B. Patel (57) ABSTRACT

A packing structure of a switching power supply is used for enhancing heat-dissipating effect. The packing structure includes a printed circuit board, a transformer, an inductor having an inductive winding, a converter placed on a pad of the printed circuit board, wherein the pad is electrically connected to a secondary winding of the transformer and the inductive winding, and a metal cover directly covered on the converter.

18 Claims, 13 Drawing Sheets

Fig. 8B ures fabricated on the substrate. The packaging structure of the present invention is illustrated in FIG. 5.

POWER SUPPLY DEVICE FOR ENHANCING HEAT-DISSIPATING EFFECT

FIELD OF THE INVENTION

The present invention relates to a switching power supply (SPS), and more particularly to a packing structure and a packing method of a mini-size power supply.

BACKGROUND OF THE INVENTION

Presently, for the development of electronic device, the volume trends to be smaller and smaller, and the current and power requirements trend to be bigger and bigger, especially for a high density switching power supply (SPS). Therefore, it is an important issue to achieve excellent heat-dissipating effect and reduce the current loading in such tiny space.

Figure 1A:
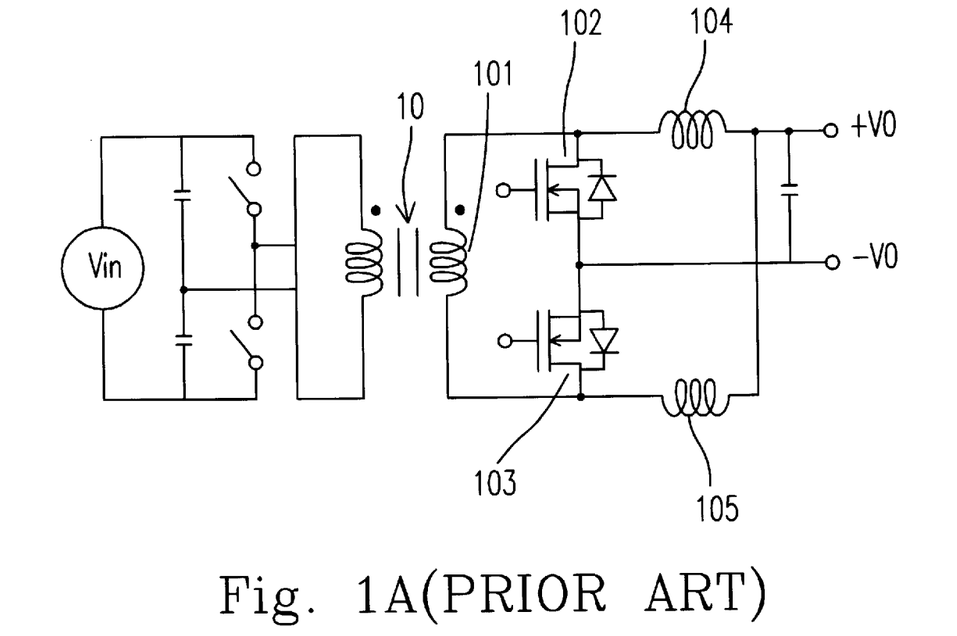
FIGS. 1A–1B are diagrams illustrating two alternative switch circuits used in the switching power supply according to the prior art.
Figure 1B:
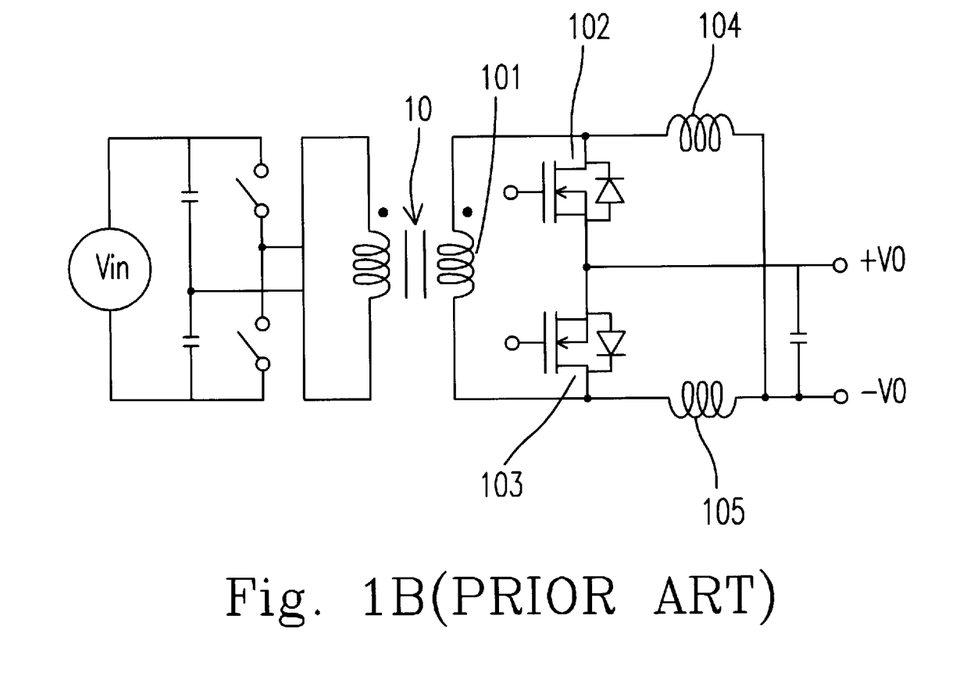

FIG. 1A is a diagram illustrating a switch circuit used in the switching power supply according to the prior art. Referring to FIG. 1A, an induced current is generated and inputted to a secondary winding 101 via a transformer 10. A set of rectifiers 102 and 103 then rectify the induced current to generate the output DC current to output through inductances 104 and 105 connected with a positive terminal (Vo) and a negative terminal (-Vo). The rectifiers 101 and 102 can either be a diode or a metal-oxide-semiconductor field effect transistor (MOSFET). FIG. 1B is a diagram illustrating an alternate circuit used in the switching power supply arranged slightly differently than that of FIG. 1A.

Figure 2:
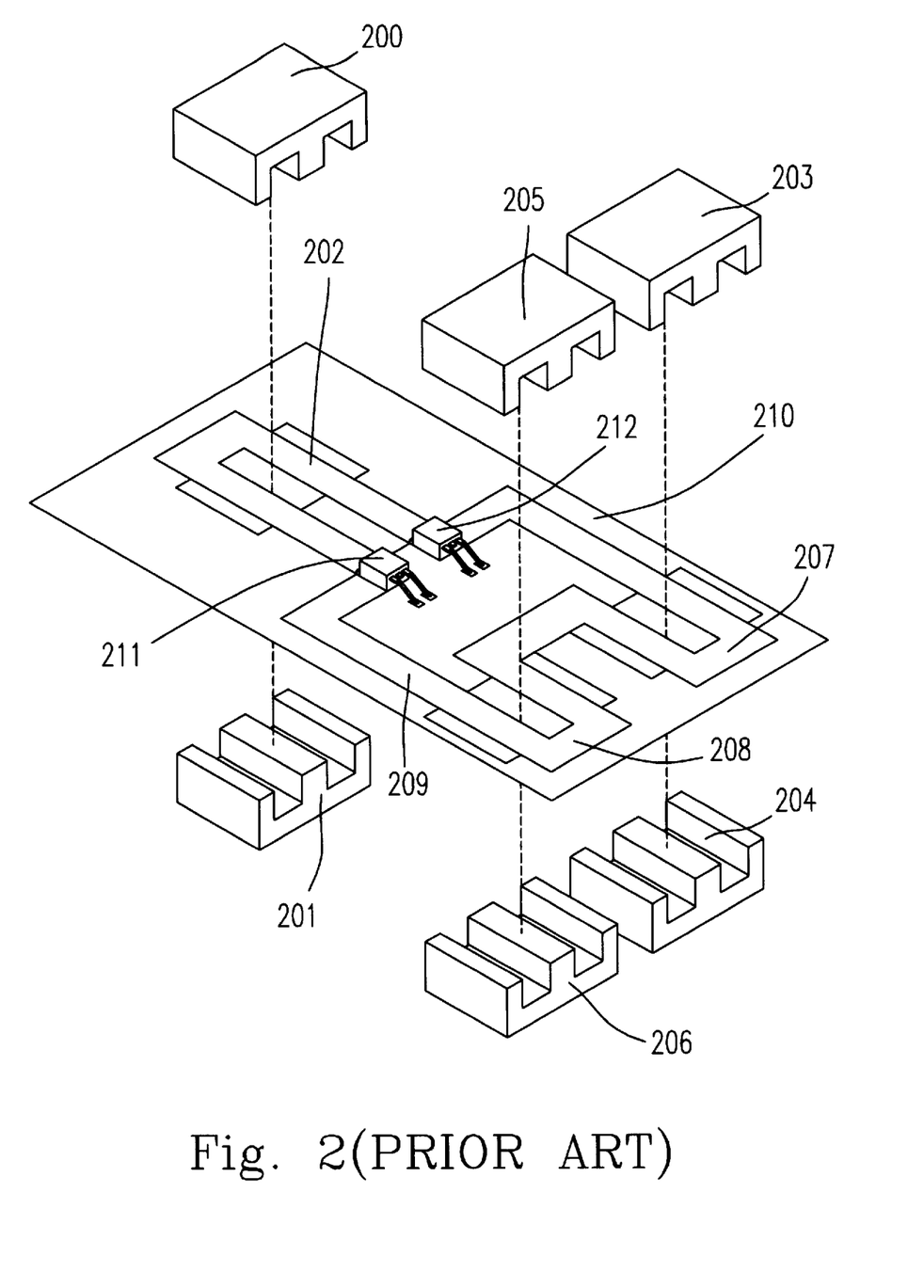
FIG. 2 is an exploded view illustrating a packed circuit in FIG. 1A according to the prior art.

FIG. 2 is an exploded three-dimensional view illustrating a packed circuit in FIG. 1A which is a general packed structure used in the industry. Cores 200, 201 and a windings 202 shown in FIG. 2 is corresponded to the secondary winding 101 in FIG. 1A. Cores 203, 204 and a windings 207 shown in FIG. 2 are corresponded to the inductance 104 in FIG. 1A, and cores 205, 206 and a winding 208 shown in FIG. 2 are corresponded to the inductance 105 in FIG. 1A. The MOSFETs 211 and 212 are corresponded to the rectifiers 103 and 102 in FIG. 1A, respectively.

Figure 3:
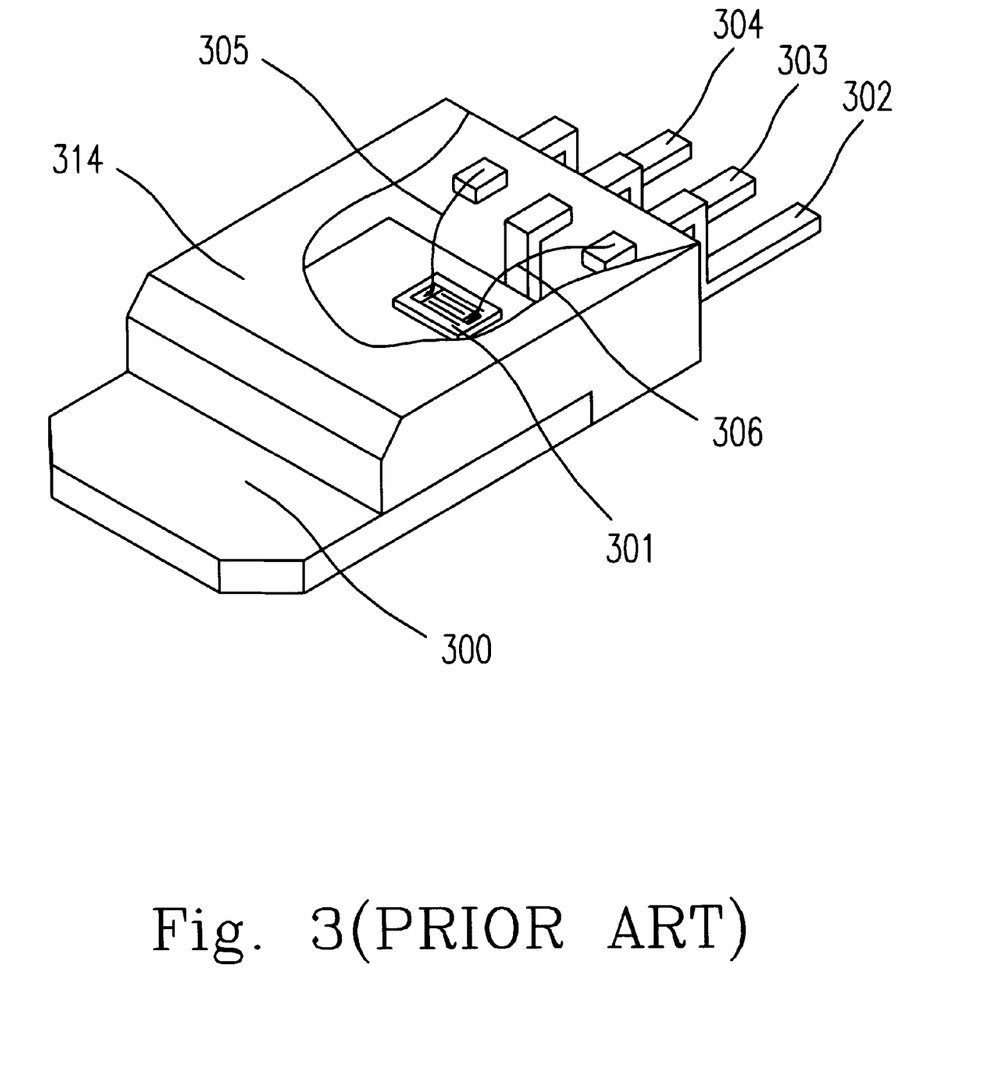
FIG. 3 is a perspective view illustrating a packed structure of MOSFET according to the prior art.

Currently, most rectifiers applied in SPS are MOSFETs. FIG. 3 is a perspective view illustrating the typical structure of a packed MOSFET. As shown in FIG. 3, a chip 301 is soldered onto a copper plate 300 which is a drain of the MOSFET. A source and a gate are bonding to two pins 302 and 304 via metal lines 306 and 305. After testing the electricity, the top of the chip 301 is packed by epoxy. Generally, the conductivity of copper is about 380 W/mk, while that of epoxy is smaller than 1 W/mk. For the general heat-dissipating mechanism, the MOSFET is connected onto a pad or a metal of a substrate by soldering or screwing, and a thermal pad is placed between the MOSFET and the substrate for heat-dissipating. Usually, the substrate is a FR4 printed circuit board and the metal is aluminum. Thus, the heat conduction pathway is to transfer the heat generated from the MOSFET to the pad of the substrate via the copper plate 300, and then dissipate the heat to the air by natural convection or forced convection.

Figure 4A:
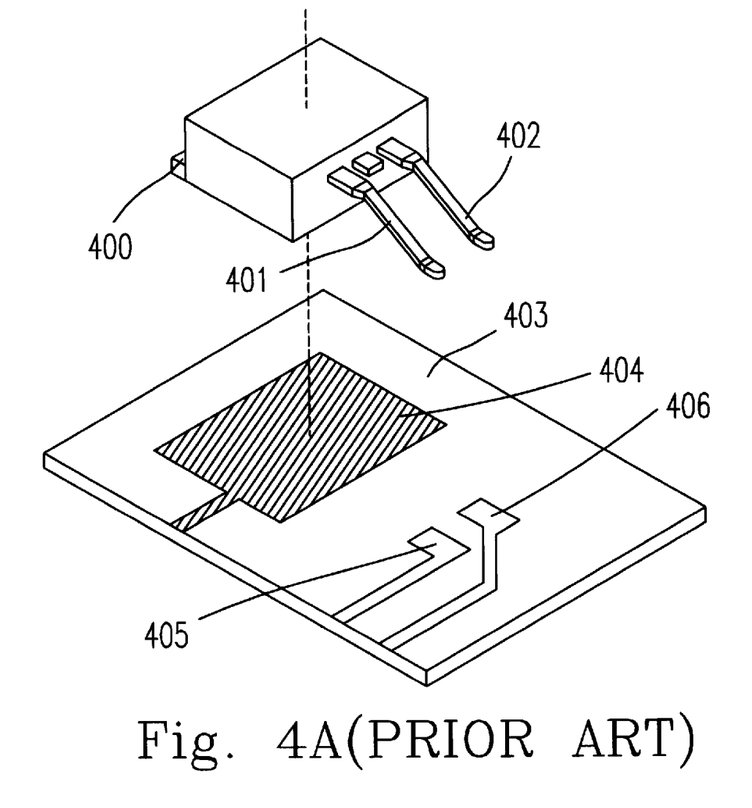
FIG. 4A is an exploded diagram illustrating a standard packed MOSFET bound to a printed circuit board according to the prior art.
Figure 4B:
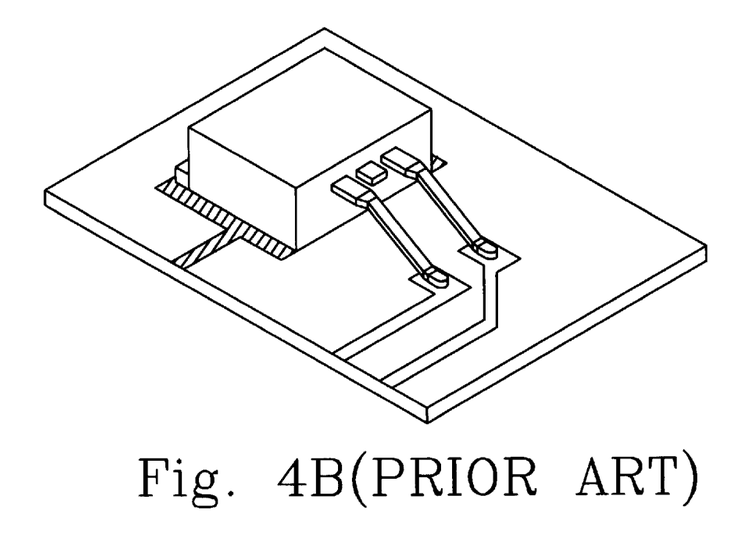
FIG. 4B is diagram illustrating an packed structure of MOSFET bound to a printed circuit board in FIG. 4A.
Figure 4C:
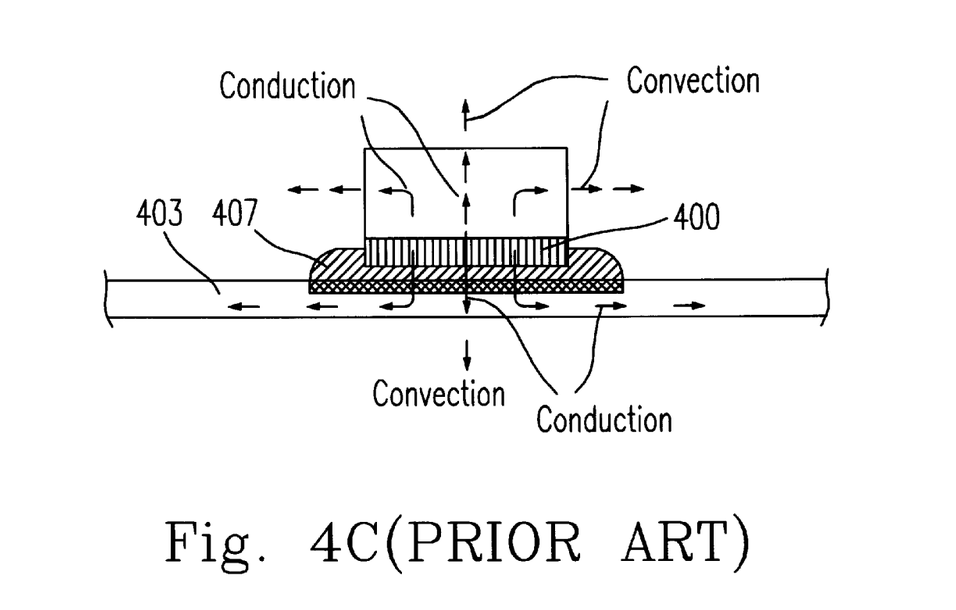
FIG. 4C is a lateral diagram illustrating a MOSFET bound to a printed circuit board in FIG. 4B.

On the other hand, most electric devices are soldered on the surface of substrate by the surface mounting technology (SMT). For SPS, the surface mounted device (SMD) is generally used in SPS designation. FIG. 4A is an exploded diagram illustrating a standard packed MOSFET bound to a printed circuit board according to the prior art. Generally, MOSFET has three pins, i.e. a gate 401, a source 402, and a drain 400 which is a copper plate. The copper plate 400 is soldered on a pad 404 of a printed circuit board 403, and the gate 401 and the source 402 are soldered on plates 405, 406 of the printed circuit board 403 respectively. After assembling, the structure is as shown in FIG. 4B. As shown in FIG. 4C, the heat conduction pathway is from the drain 400 located at the back of MOSFET to the printed circuit board 403 via a soldering material 407, i.e. the conductive materials such as tin or silver. Generally, since the material of printed circuit board is FR4 having conductivity of about 0.8 W/mk, the conduction effect is very small, i.e. the heat resistance is very large. Hence, most heat is directly transferred to the position just under the printed circuit board 403, i.e. under the MOSFET, by conduction, and dissipated into the air by convection as shown in FIG. 4C. Thus, if an electronic device which is not tolerance to heat such as capacitance is placed under the MOSFET, then the device lifetime will reduce because of high temperature generated by the MOSFET. However, since the device which could generate heat is soldered on the printed circuit board which is a FR4 material and is a bad conductor for heat, the generated heat is not easily taken away. According to the law of the conservation of energy, the temperature of the device which could generate heat will keep increasing because the generated heat cannot be dissipated, and further results in losing efficacy of the device because of the thermal run away effect.

In addition, for the power supply design having high current and high power characteristics, many MOSFETs are generally parallel connection for enhancing the efficiency, so the printed circuit board requires more thick copper line for loading larger current. Therefore, the space on the printed circuit board is occupied.

Summarily, the problems of the heat-dissipating effect, loading larger current and the space-consumption are still required to be solved in current industry. Therefore, the purpose of the present invention is to develop a method to deal with the above situations encountered in the prior art.

SUMMARY OF THE INVENTION

It is therefore an object of the present invention to propose a packing structure of a switching power supply for enhancing heat-dissipating effect.

It is therefore another object of the present invention to propose a packing structure of a switching power supply for loading and outputting more current.

It is therefore an additional object of the present invention to propose a packing structure of a switching power supply having the smaller packaged volume.

According to one aspect of the present invention, there is provided a packing structure of a switching power supply for enhancing heat-dissipating effect. The packing structure includes a printed circuit board, a transformer, an inductor having an inductive winding, a converter placed on a pad of the printed circuit board, wherein the pad is electrically connected to a secondary winding of the transformer and the inductive winding, and a metal cover directly covered on the converter.

Certainly, the metal cover can be made of copper.

Certainly, the converter can be a metal-oxide-semiconductor field effect transistor (MOSFET) having a drain directly connected to the metal cover and a source and a gate directly connected to the pad of the printed circuit board.

Preferably, the packing structure further includes a heatsink placed on the metal cover for enhancing heat-dissipating, or/and a thermal pad placed between the metal cover and the heatsink for conducting heat.

Preferably, the packing structure further includes a metal strip electrically connected to the metal cover, the inductive winding and the secondary winding of the transformer. The metal strip and the inductive winding can be integrally formed. The metal strip can be made of copper.

Certainly, the converter can be a diode having an anode electrically connected to the inductor and a cathode directly connected to a pad of the printed circuit board.

Certainly, the printed circuit board can be made of a material selected from FR4 and thermal clad.

According to another aspect of the present invention, there is provides a packing structure of a switching power supply for enhancing heat-dissipating effect. The packing structure includes a printed circuit board, a transformer, an inductor having an inductive winding, a metal strip electrically connected to the inductive winding, and a converter electrically connected to the metal strip and covered by the metal strip.

According to an additional aspect of the present invention, there is provides a method for packing a switching power supply to enhance heat-dissipating effect. The method includes steps of placing a converter on a pad of a printed circuit board, placing an inductor and a transformer on the printed circuit board, and electrically connecting a metal cover to the pad, an inductive winding of the inductor and a secondary winding of the transformer for enhancing heat-dissipating effect.

The present invention may best be understood through the following description with reference to the accompanying drawings, in which:

DETAILED DESCRIPTION OF THE PREFERRED EMBODIMENTS

Figure 5A:
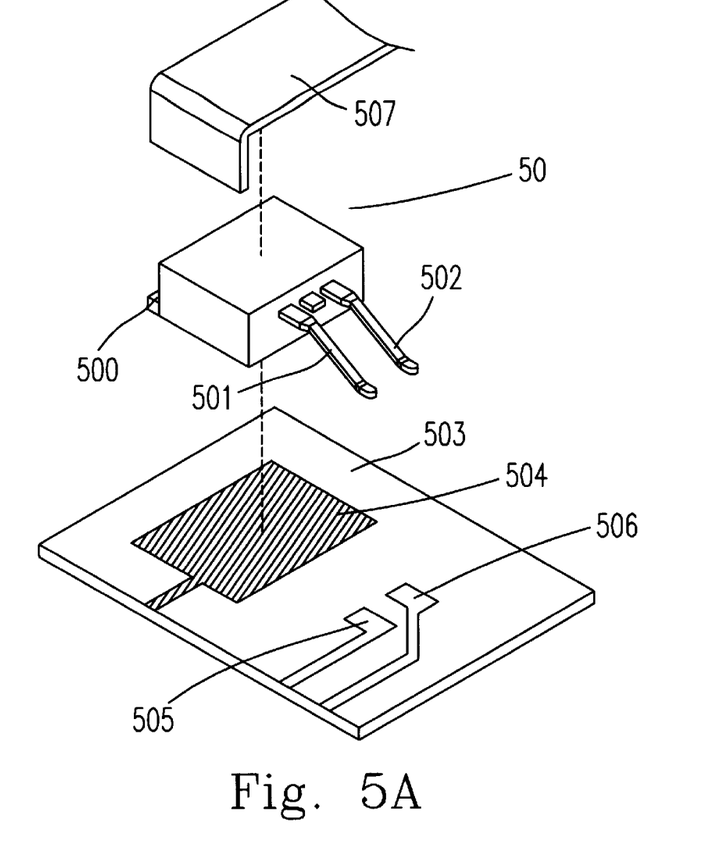
FIG. 5A is an exploded diagram illustrating a standard packed MOSFET bound to a printed circuit board according to one preferred embodiment of the present invention.
Figure 5B:
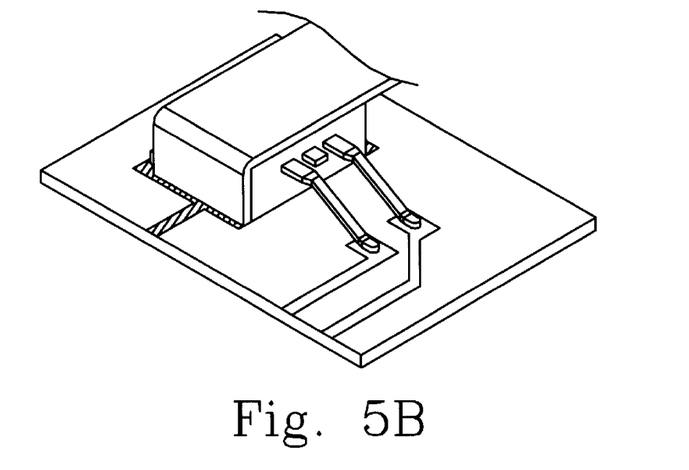
FIG. 5B is diagram illustrating an packed structure of MOSFET bound to a printed circuit board in FIG. 5A.
Figure 5C:
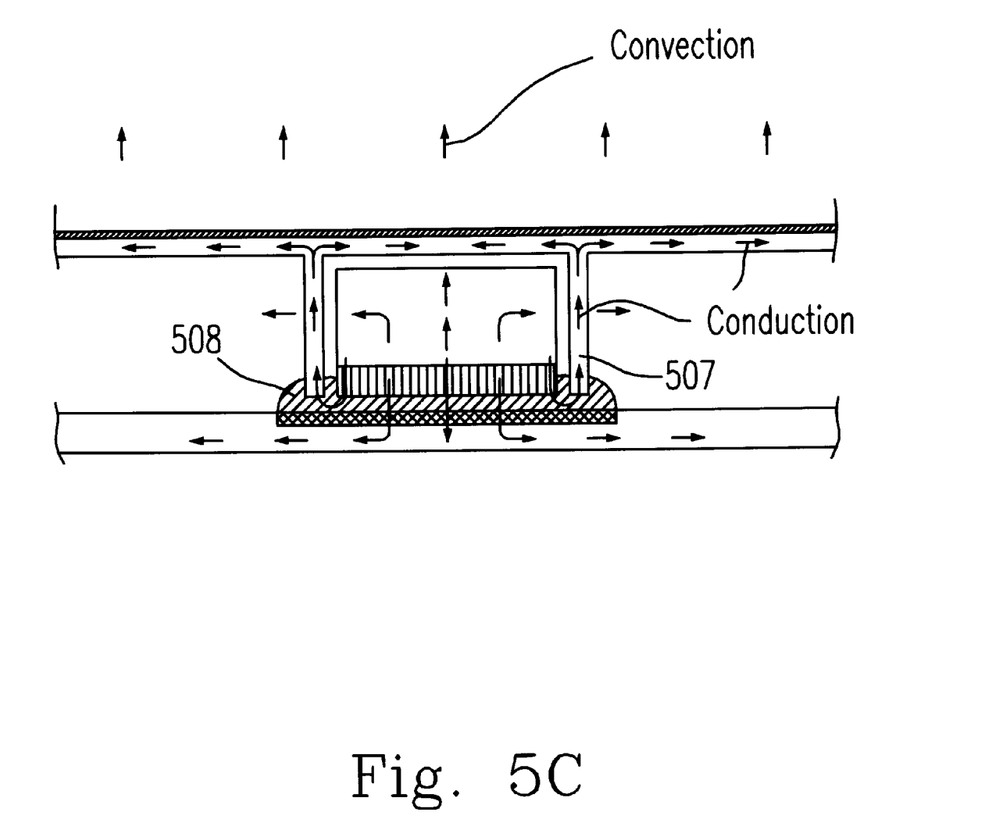
FIG. 5C is a diagram illustrating a thermal dissipation distribution in FIG. 5B.

Referring to FIGS. 5A–5C, a standard packaged MOSFET and a copper cover used for heat-dissipating are soldered to a printed circuit board 503 simultaneously in order to increase heat-dissipating effect and prevent too much current from transmitting to the printed circuit board 503. As shown in FIG. 5A, a drain 500 of the MOSFET 50 is soldered on a pad 504 of the printed circuit board 503. A gate 501 and a source 502 are soldered on a pad 505 and a pad 506 of the printed circuit board 503, respectively. Then, a copper cover 507 is soldered on the pad 504 of the printed circuit board 503. Because the copper cover 507 is directly connected to the pad 504, the copper cover 507 is also a drain of the MOSFET 50. FIG. 5B is an assembly structure of FIG. 5A. Because the thermal conduction coefficients of the copper and the soldering materials such as tin and silver are much greater than that of the substrate, the major thermal flow is transferred from the drain 500 of the MOSFET to a soldering material 508, then transferred to the copper cover 507, and is dissipated into air by convection, as shown in FIG. 5C. In addition, partial heat will be conducted to the bottom of the printed circuit board 503, and is also dissipated into the air by convection. Hence, the electronic devices directly under the MOSFET 50 are still affected by the heat occurred by the MOSFET. Thus, if the heat-dissipating area of copper cover is increased, e.g. adhering a thermal pad on the copper cover as a medium for conducting heat and adding a heatsink thereon, then the temperature of the MOSFET will decrease. Further, the temperature of the electronic device located under the printed circuit board 503 will decrease, too.

Figure 6A:
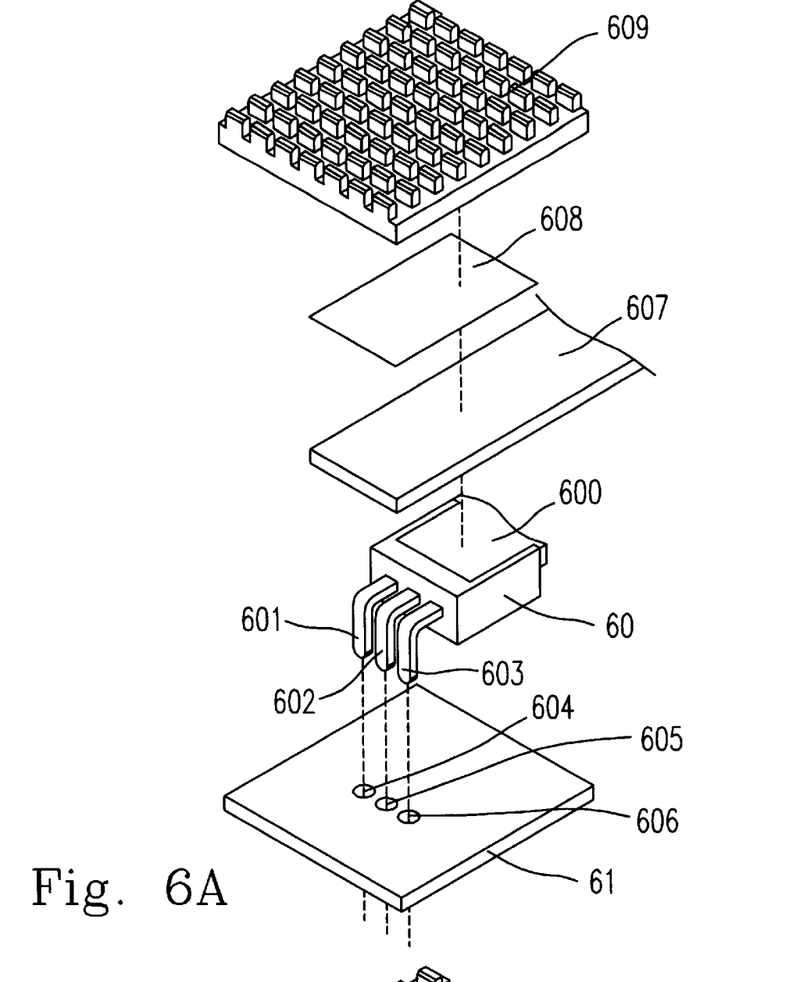
FIG. 6A is an exploded diagram illustrating a standard packed MOSFET bound to a printed circuit board according to another preferred embodiment of the present invention.
Figure 6B:
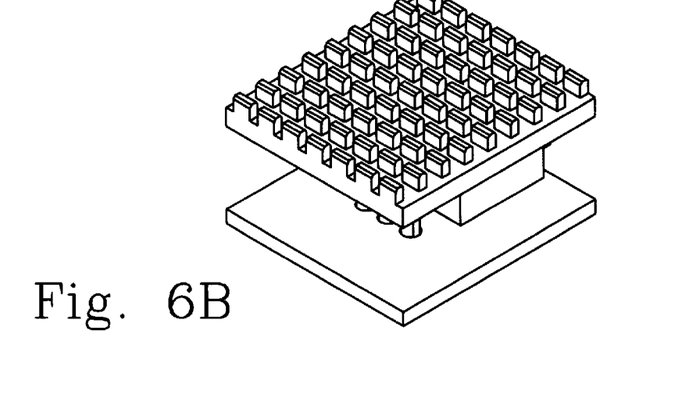
FIG. 6B is diagram illustrating an packed structure of MOSFET bound to a printed circuit board in FIG. 6A.
Figure 6C:
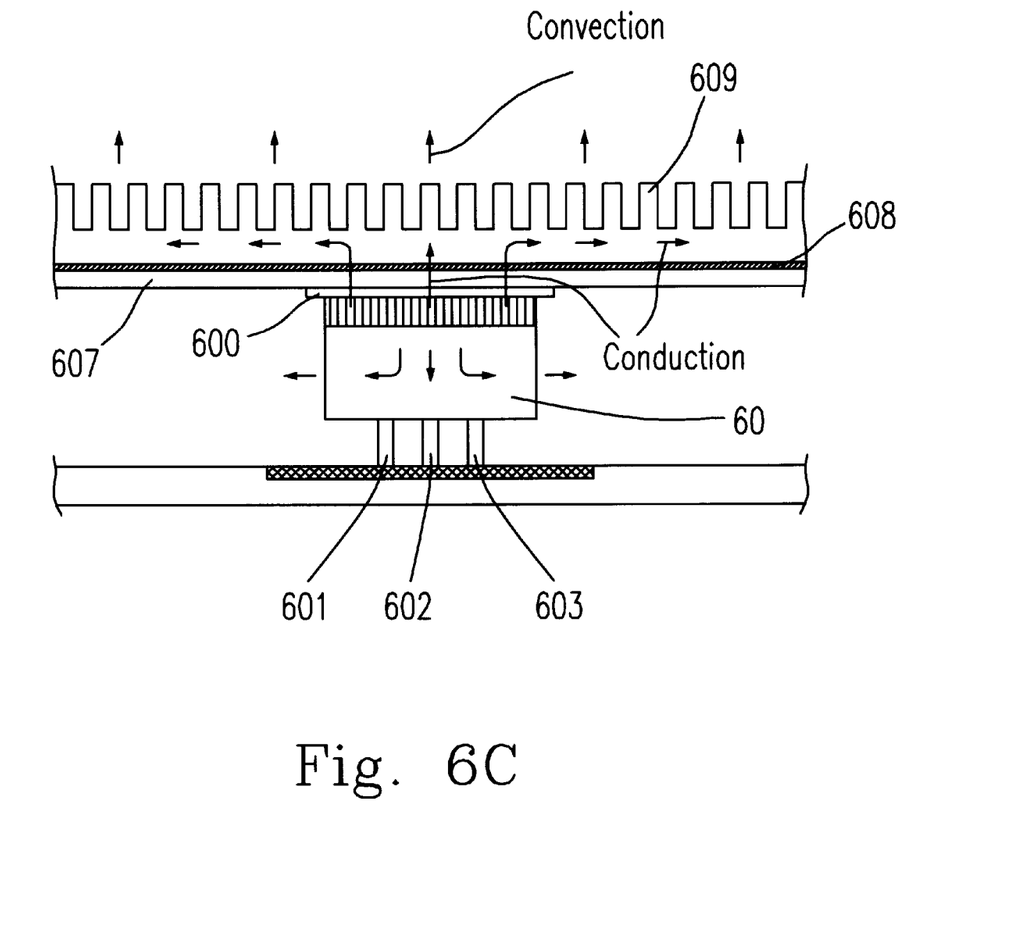
FIG. 6C is a diagram illustrating a thermal dissipation distribution in FIG. 6B.

Referring to FIG. 6, the MOSFET is pinged into the printed circuit board instead of being placed on the printed circuit board by SMT technology. Three pins of MOSFET 60, i.e. a drain 602, a source 601 and a gate 603, are soldered into three holes 605, 604, 606 of the printed circuit board 61, respectively. A heat-dissipating copper plate 607 is soldered on a copper plate 600 of the MOSFET 60 directly, so the heat-dissipating copper plate 607 is also a drain of the MOSFET 60. A thermal pad 608 is adhered on the heat-dissipating copper plate 607 as a medium for conducting. Finally, a heatsink 609 is added on the thermal pad 608. FIG. 6B is an assembly structure of FIG. 6A. Because the major thermal flow is directly transferred from the drain 600 of the MOSFET to the heat-dissipating copper plate 607, to the thermal pad 608, then to the heatsink 609, and is dissipated into air by convection, as shown in FIG. 6C. In addition, the printed circuit board 61 is slightly affected by the heat occurred from the MOSFET 60 because there are only three pins 602, 601, 603 of the MOSFET 60 to connect to the printed circuit board. Therefore, the thermal effect on the electronic devices under the printed circuit board by the heat transferred from the MOSFET also reduces.

Figure 4D:
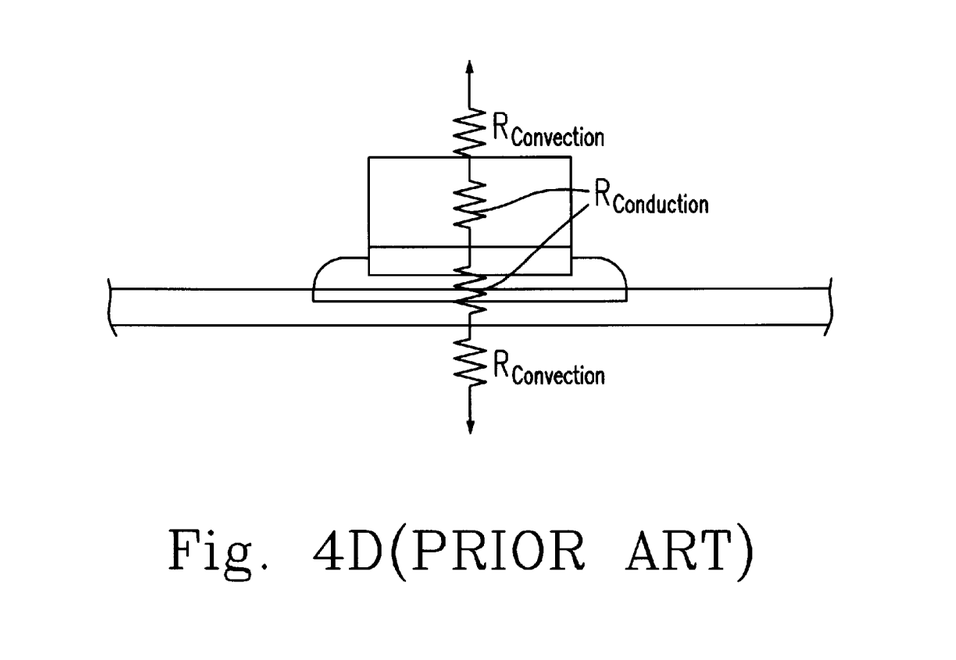
FIG. 4D is a diagram illustrating a thermal resistance distribution in FIG. 4C.

In order to explain the relation of the heat-dissipating effect and the heat-dissipating area, FIGS. 4C and 4D are as examples. As shown in FIG. 4C, the thermal flow is transferred from the MOSFET to the printed circuit board by conduction, then is dissipated into air by convection.

During conduction, the conduction resistance ($R_{conduction}$) and the convection resistance ($R_{convection}$) are occurred as shown in FIG. 4D.

Since the main heat-dissipating pathway is convection, the heat transfer is only focused on the convection. The thermal resistance of convection can be shown as the following equation:

$$R_{convection} = \frac{1}{hA} = \frac{T_{MOSFET} - T_{AMBIENT}}{P}$$

Wherein h is a heat transfer coefficient, A is the heat-dissipating area, P is consumption power, $T_{MOSFET}$ is the temperature of MOSFET, and $T_{ambient}$ is the ambient temperature. Generally, for certain P, the smaller the thermal resistance of the convection is, the lower the temperature of the electronic device is under $T_{AMBIENT}$. According to above equation, the convection resistance is inversely proportional to the average heat transfer coefficient and the heat-dissipating area. Under forced convection, the average heat transfer coefficient is changed along with the fluid flow speed, e.g. the ambient air flow speed. Hence, if the air flow speed and the ambient temperature are fixed, the convection resistance is only inversely proportional to the heat-dissipating area.

That is, the larger the heat-dissipating area is, the smaller the convection resistance is. Therefore, for enhancing the heat-dissipating effect of the electronic device, it is important to increase the heat-dissipating area.

Figure 7A:
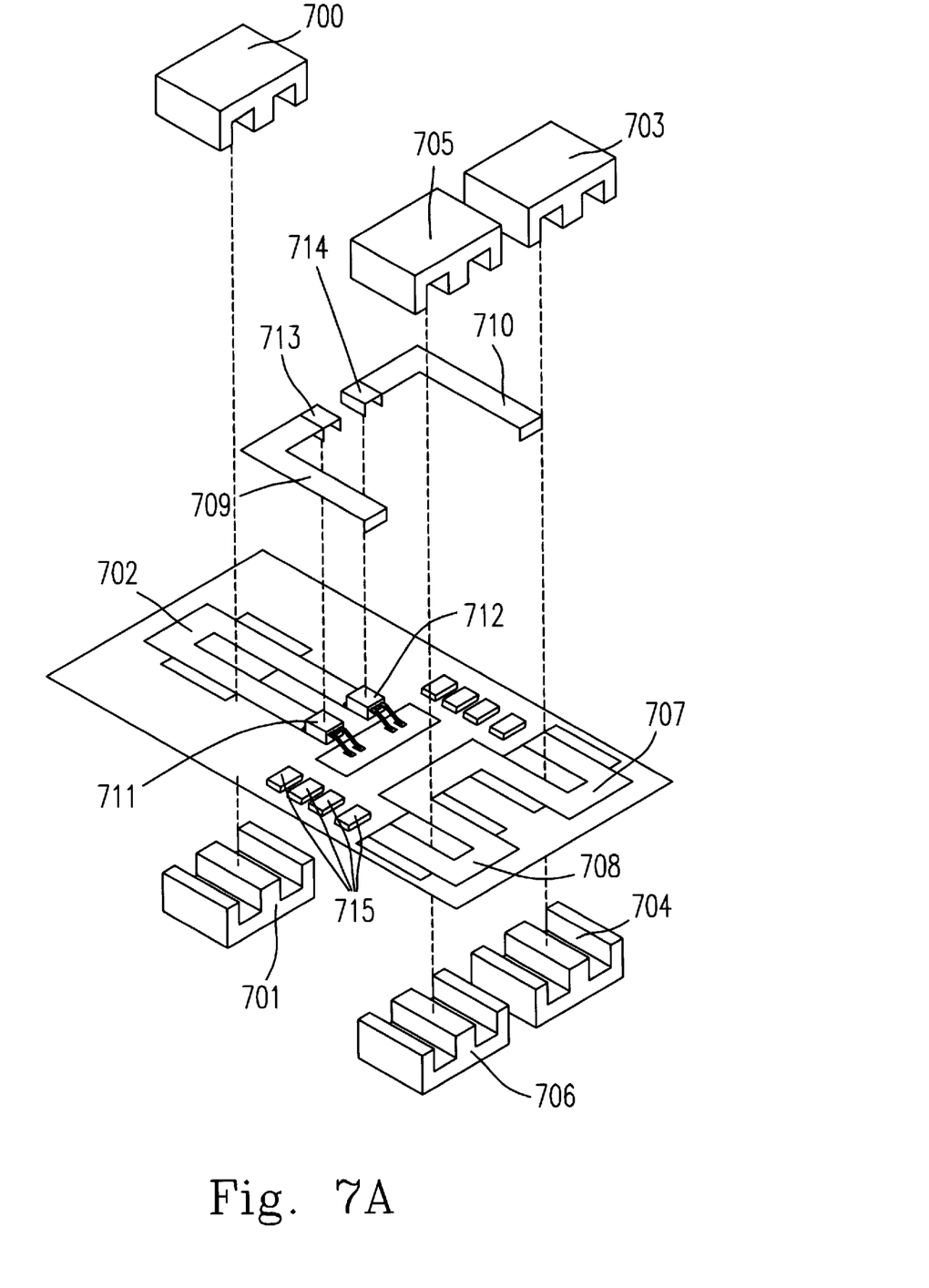
FIGS. 7A–7B are exploded diagrams illustrating two alternative switch circuits used in the switching power supply according to one preferred embodiment of the present invention.
Figure 7B:
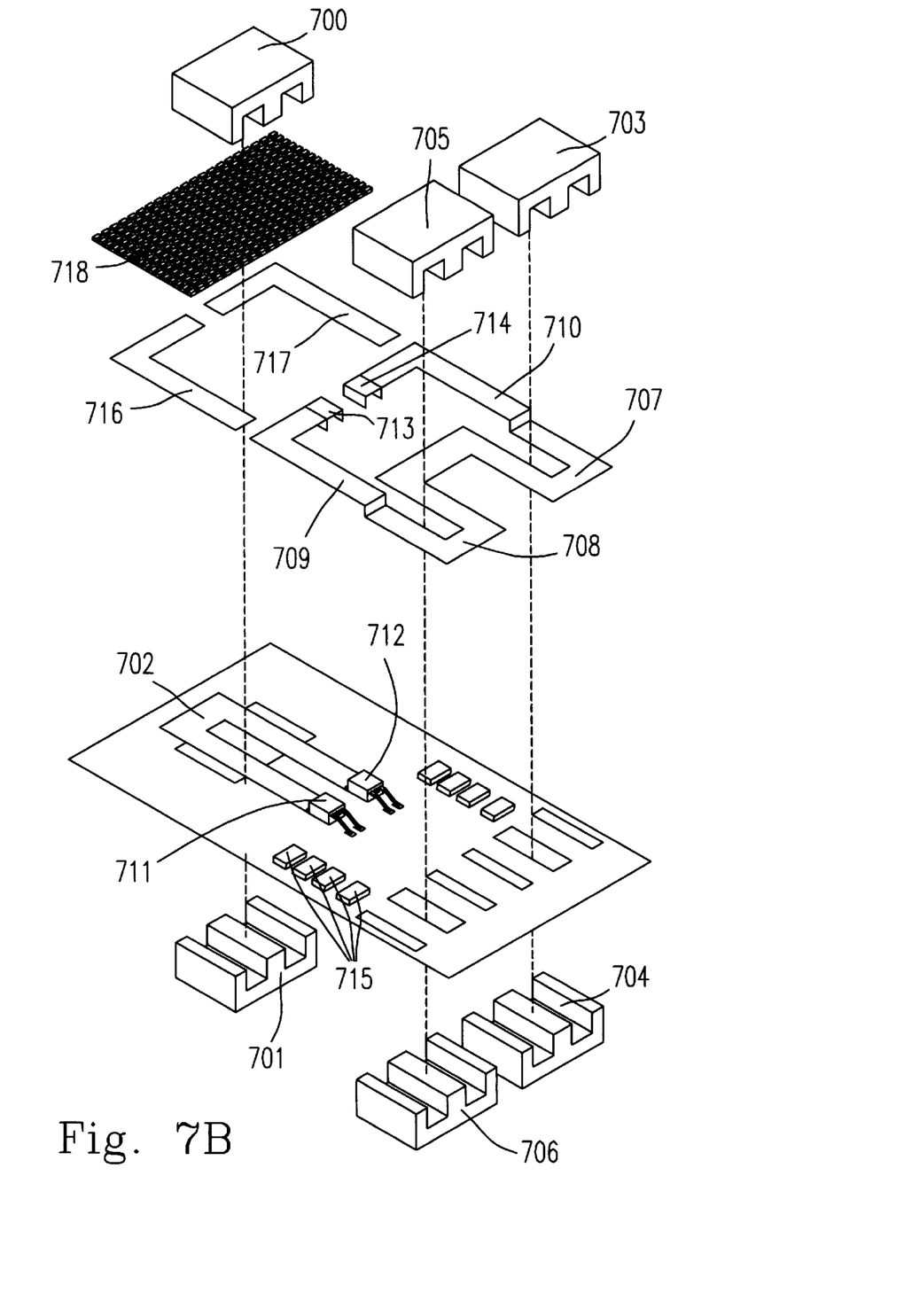

FIGS. 7A–7B are exploded diagrams illustrating two packaged methods used in the switching power supply according to one preferred embodiment of the present invention. As shown in FIG. 7A, the packaged method in FIG. 7A is similar to that in FIG. 2 except that two copper covers 713 and 714 are added and soldered on the MOSFETs 711 and 712, respectively. The copper covers 713 and 714 are also the drains of the MOSFETs 711 and 712, respectively. The copper covers 713 and 714 are soldered to copper strips 709 and 710 respectively or a same part, then soldered to windings 702, 707 and 708. Thus, the circuit structure such as FIG. 1A is formed. In addition, the heat-dissipating copper covers 713, 714, the copper strips 709, 710, and the windings 707, 708 can be formed integrally to a copper member as shown in FIG. 7B. Referring to FIGS. 7A and 7B, the spaces under the copper strips 709 and 710 allow some electronic devices 715, e.g. a resistance, to be placed, so the using-space of the printed circuit board could be increased according to the present invention. In addition, the heat-dissipating copper covers 713 and 714 can enhance heat-dissipating effect and prevent overloading current from conducting to the printed circuit board. A heatsink or spreader 718 can be placed on the top of the heat-dissipating copper covers 713 and 714 to further enhance heat-dissipating effect, and that have insulating thermal pads 716, 717 between heatsink 718 and copper cover 713, 714, copper strips 709, 710.

Figure 8A:
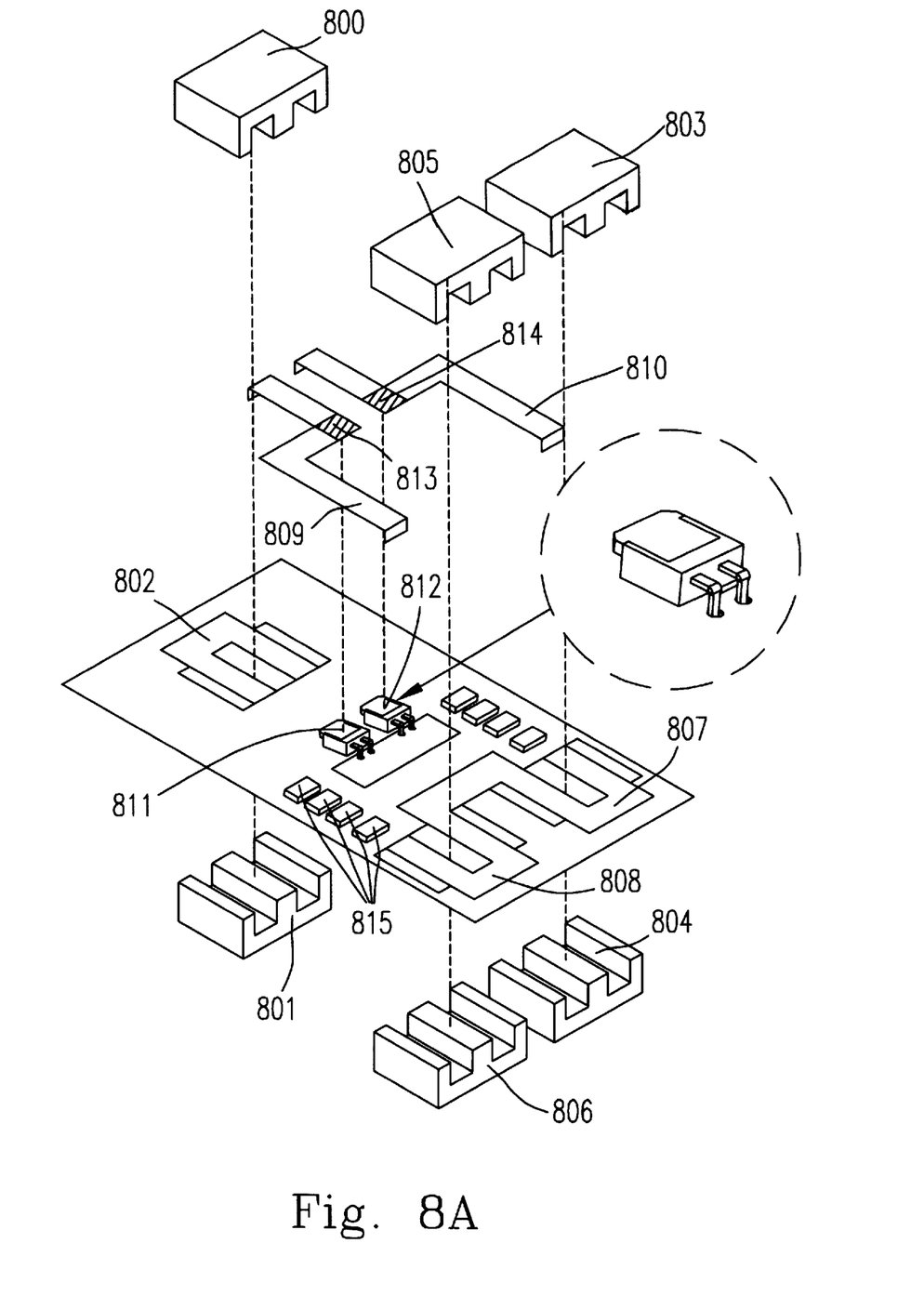
FIGS. 8A–8B are exploded diagrams illustrating two alternative switch circuits used in the switching power supply according to another preferred embodiment of the present invention.
Figure 8B:
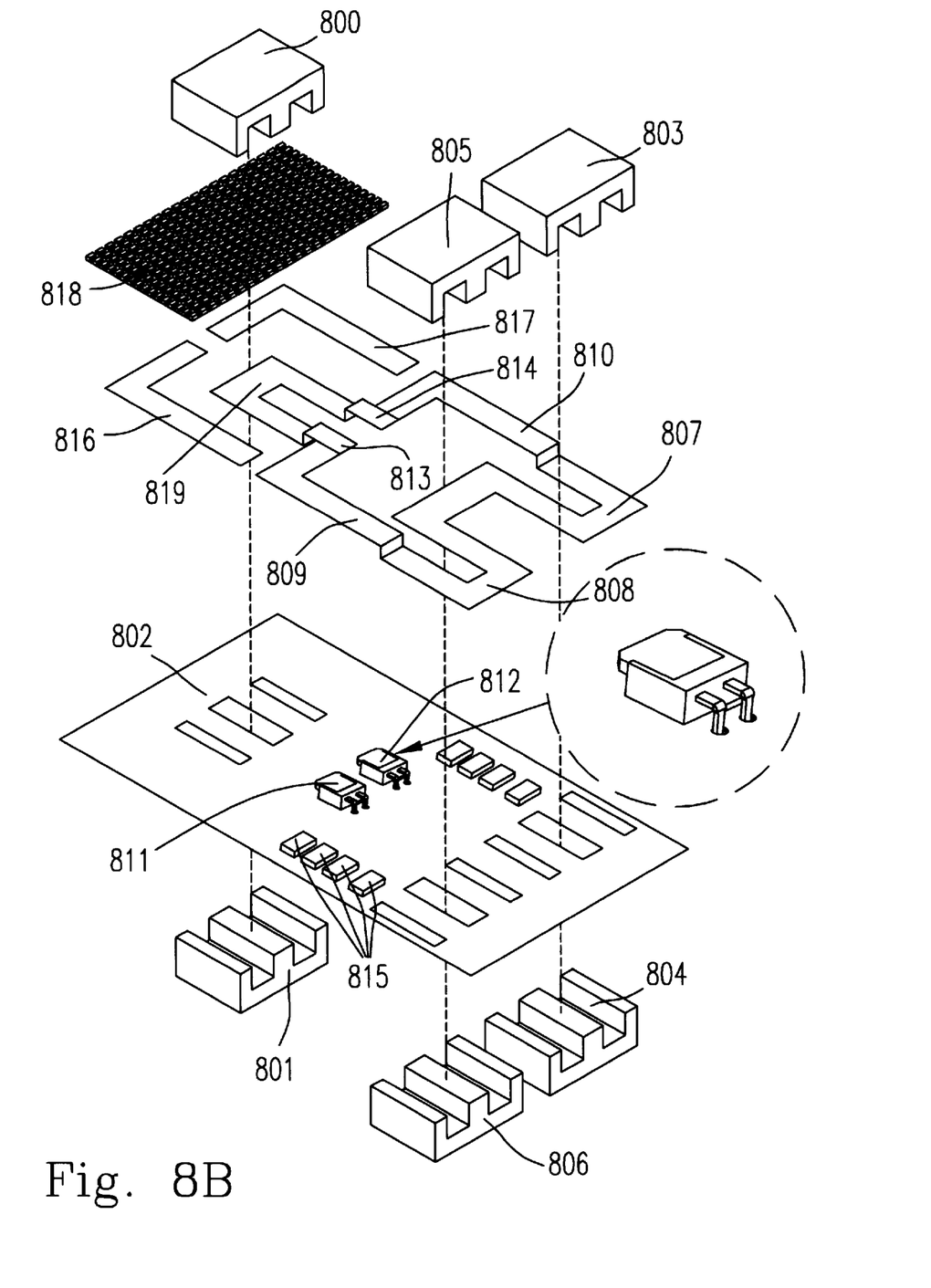

In addition, the two pins of MOSFETs 811, 812, i.e. the gate and the source, can be formed at a right angle as shown in FIG. 8A. The copper drains located at the back of the MOSFETs 811, 812 are directly soldered to copper strips 809 and 810 at the positions of 813 and 814, respectively. Thus, the copper strips 809 and 810 are also the drains of the MOSFETs 811 and 812. The copper strips 809 and 810 are soldered to windings 802, 807, and 808 as shown in FIG. 8A, or are integrally formed therewith as shown in FIG. 8B. Similarly, the spaces under the copper strips 809 and 810 also allow some electronic devices 815 to be placed in, so the using-space of the printed circuit board can be increased according to the present invention. In addition, the positions 813 and 814 can be copper covers. The copper covers 813 and 814 can enhance heat-dissipating effect and prevent overloading current from conducting to the printed circuit board. Furthermore, a heatsink or spreader 818 can be placed on the top of the heat-dissipating copper covers 813 and 814 to further enhance heat-dissipating effect, and that have insulating thermal pads 816, 817 between heatsink 818 and copper cover 813, 814, copper strips 809, 810.

In sum, the advantages of the present invention are as the following advantages of:

(1) increasing the heat-dissipating area for enhancing the heat-dissipating effect, (2) soldering the copper plate to the drain of MOSFET for preventing too much current from transferring from the drain to the printed circuit board, and (3) reducing the packaged volume for increasing using-space of the printed circuit board.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A packing structure of a switching power supply, comprising:
    a printed circuit board;
    a transformer;
    an inductor having an inductive winding;
    a converter placed on a pad of said printed circuit board, wherein said pad is electrically connected to a secondary winding of said transformer and said inductive winding; and
    a metal cover electrically connected to said pad of said printed circuit board and directly covered on said converter for simultaneously preventing too much current from transmitting to said printed circuit board and increasing thermal conduction.

2. The packing structure according to claim 1, wherein said metal cover is made of copper.

3. The packing structure according to claim 1, wherein said converter is a metal-oxide-semiconductor field effect transistor (MOSFET) having a drain directly connected to said metal cover and a source and a gate directly connected to said pad of said printed circuit board.

4. The packing structure according to claim 1, further comprising a heatsink placed on said metal cover for enhancing heat-dissipating.

5. The packing structure according to claim 4, further comprising a thermal pad placed between said metal cover and said heatsink for conducting heat.

6. The packing structure according to claim 1, further comprising a metal strip electrically connected to said metal cover, said inductive winding and said secondary winding of said transformer.

7. The packing structure according to claim 6, wherein said metal strip and said inductive winding are integrally formed.

8. The packing structure according to claim 6, wherein said metal strip is made of copper.

9. The packing structure according to claim 1, wherein said converter is a diode having an anode electrically connected to said inductor and a cathode directly connected to a pad of said printed circuit board.

10. A packing structure of a switching power supply, comprising:

a printed circuit board;

a transformer;

an inductor having an inductive winding;

a converter electrically connected to a pad of said printed circuit board, wherein said pad is electrically connected to a secondary winding of said transformer and said inductive winding; and a metal strip electrically connected to said converter and directly covered on said converter, whereby conducting a current to said metal strip and conducting a thermal flow upwardly from said converter to a portion of said metal strip which is in direct contact with said converter and then laterally from said portion of said metal strip toward said inductive winding through said metal strip to reduce current and heat conductions to said printed circuit board.

11. The packing structure according to claim 10, wherein said converter is a metal-oxide-semiconductor field effect transistor (MOSFET) having a drain directly connected to said metal strip and a source and a gate directly connected to said pad of said printed circuit board.

12. The packing structure according to claim 10, further comprising a heatsink placed on said metal strip for enhancing heat-dissipating.

13. The packing structure according to claim 12, further comprising a thermal pad placed between said metal strip and said heatsink for conducting heat.

14. The packing structure according to claim 10, wherein said metal strip and said inductive winding are integrally formed.

15. A packing structure of a switching power supply, comprising:

a printed circuit board;

a transformer;

an inductor having an inductive winding;

a converter placed on a pad of said printed circuit board, wherein said pad is electrically connected to a secondary winding of said transformer and said inductive winding;

a metal cover directly covered on said converter and electrically connected to said pad; and a metal strip electrically connected to said metal cover, said inductive winding and said secondary winding of said transformer for simultaneously reducing current transmitting to said printed circuit board and increasing heat conduction.

16. The packing structure according to claim 15, wherein said converter is a metal-oxide-semiconductor field effect transistor (MOSFET) having a drain directly connected to said metal cover and a source and a gate directly connected to said pad of said printed circuit board.

17. The packing structure according to claim 15, wherein said metal strip and said inductive winding are integrally formed.

18. The packing structure according to claim 15, wherein said metal strip is made of copper.

* * * * *